United States Patent [19]

Page, Jr. et al.

[11] Patent Number: 4,844,006
[45] Date of Patent: Jul. 4, 1989

[54] APPARATUS TO PROVIDE A VAPORIZED REACTANT FOR CHEMICAL-VAPOR DEPOSITION

[75] Inventors: Theron V. Page, Jr., Lake Oswego; Thomas F. Boydston, Tualatine; John G. Posa, Tigard, all of Oreg.

[73] Assignee: Akzo America Inc., New York, N.Y.

[21] Appl. No.: 164,677

[22] Filed: Mar. 7, 1988

[51] Int. Cl.$^4$ .................................... C23C 16/00
[52] U.S. Cl. .................................. 118/719; 118/715; 118/725
[58] Field of Search ............... 118/715, 719, 725

[56] References Cited

U.S. PATENT DOCUMENTS

| | | | |
|---|---|---|---|
| 4,436,674 | 3/1984 | McMenamin | 261/64 B |
| 4,446,817 | 5/1984 | Crawley | 118/725 |
| 4,568,397 | 2/1986 | Hoke et al. | |
| 4,596,208 | 6/1986 | Wolfson et al. | 118/712 |
| 4,640,221 | 2/1987 | Barbee et al. | 118/689 |
| 4,747,367 | 5/1988 | Posa | 118/715 |
| 4,761,269 | 8/1988 | Conger et al. | 422/245 |

FOREIGN PATENT DOCUMENTS 8606811 11/1986 PCT Int'l Appl. .

OTHER PUBLICATIONS

"Model 425-MCT MOCVD HgCdTe Epitaxial Reactor", Crystal Specialities, Inc. 1986, Portland Oregon.

Primary Examiner—Richard Bueker
Attorney, Agent, or Firm—David H. Vickrey; Louis A. Morris

[57] ABSTRACT

An apparatus to provide a vaporized reactant for chemical-vapor deposition is disclosed. The apparatus employs a heated quartz reactant reservoir, quartz lines, a quartz valve and, optionally, a purge system. The apparatus may also include a quartz refill reservoir and heating means for the quartz lines. The purge system may be a vacuum purge system.

11 Claims, 1 Drawing Sheet

APPARATUS TO PROVIDE A VAPORIZED REACTANT FOR CHEMICAL-VAPOR DEPOSITION

BACKGROUND OF THE INVENTION

This invention is directed to an apparatus to provide a vaporized reactant for chemical-vapor deposition. More specifically, the invention is directed to an apparatus which utilizes a heated quartz reservoir, a quartz valve and quartz supply lines to provide a vaporized reactant for chemical-vapor deposition.

Numerous semiconductor alloys are being found to be useful in electronic and optoelectronic applications. Group III–V materials comprised of elements such as gallium arsenic, indium, phosphorous and aluminum are becoming increasing important as adjuncts to silicon already in widespread use in high-speed integrated circuits and optoelectronic emission and detection devices operable in the visible region of the spectrum. Group II–VI materials comprised of elements such as mercury, cadmium, tellurium, zinc, sulphur and selenium are valuable for infrared detection. Compounds using sulphur and selenium are particularly used in blue and ultraviolet optoelectronic applications. It is also possible to combine various elements to produce desired electromagnetic behavior, including superconductivity.

Various techniques have been developed to deposit such materials in the form of thin films and to grow them epitaxially on suitable substrates. In particular, chemical-vapor deposition is emerging as a useful technique in that it provides more uniform layer thickness and improved surface control when compared to liquid-phase techniques.

In chemical-vapor deposition (also referred to "vapor-phase epitaxy"), all reactants arrive in the gaseous state for deposition on a substrate. In response to the various properties of different chemical elements, a variety of vaporization and delivery techniques have been developed. In some cases, elemental sources may be heated and vaporized or sublimed directly. In other cases, elements may be combined with hydrogen to form a hydride which is a stable gas at room temperature. For example, hydrogen will react with arsenic to form arsine ($AsH_3$), with phosphorous to form phosphine ($PH_3$), with sulphur to form hydrogen sulfide ($H_2S$) and with selenium to form hydrogen selenide ($H_2Se$).

For heavier metals or for elements which do not conveniently form hydrides or other suitable gasses, organometallic compounds, such as the metal alkyls trimethyl-gallium [$(CH_3)_3Ga$] and trimethylaluminum [$(CH_3)_3Al$], are utilized in metal-organic chemical-vapor deposition (MOCVD) processes. In MOCVD processes, a carrier gas, such as hydrogen, is bubbled through or passed over organometallic compounds to produce an intermediate chemical vapor that remains stable until a reaction zone or a deposition area is reached.

Such techniques are particularly useful if the developed vapor exhibits a suitably high vapor pressure at or near room temperature. If the vapor pressure is insufficient at room temperature, the delivery apparatus may have to be heated to enhance the vapor pressure. Importantly, all portions of the delivery apparatus which are placed after vaporization of the reactant must be maintained at a temperature sufficient to sustain a vaporized reactant. Any cooler sections of the apparatus may attract and condense the vapor back into a liquid or a solid. For this reason, external heat sources, such as heat lamps or heating tape, may be applied to those portions of the apparatus occurring after vaporization of the reactant.

U.S. Pat. No. 4,568,397 to Hoke et al. discloses a method for growing a Group II–VI epitaxial layer on a substrate. Part of the method disclosed in Hoeke et al. includes heating a Group II metal (such as mercury) to at least 240° C. in a quartz reservoir and directing a flow of a carrier gas (such as hydrogen) over the heated Group II metal. The lines from the quartz reservoir to the substrate deposition area are heated quartz tubes.

U.S. Pat. No. 4,640,221 to Barbee et al. discloses a system for forming a layer of a material on a surface from a gas. The system in Barbee et al. includes a reservoir for heating a material to form a gas, a low pressure reactor for forming the layer and a connecting means between the reservoir and the reactor. Alternatively, the connecting means is heated to a temperature higher than the temperature of the reactor.

U.S. Pat. No. 4,436,674 to McMenamin discloses a chemical vapor delivery system including a container partially filled with the material to be vaporized, a means for controlling the temperature of the material in the container, and a method for providing a continuous uniform mass flow of the vaporized material.

WO 86/06811 recognizes the need for valving which can be used in systems directing high-purity chemicals which are reactive with oxygen or moisture. Such systems are frequently encountered in the manufacture of electronic devices, optical devices and semiconductor devices. WO 86/06811 discloses a valve composed of an inert polymer and having a layer of metal impermeable to oxygen and moisture.

Regardless of recent advancements made in the art of chemical-vapor deposition there is a continuing need for a chemical-vapor deposition apparatus which can be easily purged to facilitate safe loading and unloading of the substrate into the chemical-vapor deposition area. Additionally, it is desirable to be able to quickly shift between delivery of vaporized reactant and delivery of other reactants or only carrier gas to a chemical-vapor deposition area. There is also a continuing need for an apparatus which can provide a reactant reservoir having a substantially constant reactant level.

SUMMARY OF THE INVENTION

Accordingly, the invention is, in one embodiment, an apparatus suitable for providing vaporized reactant for chemical-vapor deposition. The apparatus comprises: (a) a heated quartz reactant reservoir for providing a vaporized reactant for chemical-vapor deposition, said reactant reservoir having a reactant reservoir carrier gas inlet and a vaporized reactant outlet; (b) a carrier gas header having a carrier gas inlet conduit, a first carrier gas outlet conduit and a second carrier gas outlet conduit, said first carrier gas outlet conduit connecting at its end opposite said carrier gas header with said reactant reservoir carrier gas inlet; (c) a first carrier gas valve in said first carrier gas outlet conduit and a second carrier gas valve in said second carrier gas outlet conduit; (d) a reactant outlet conduit connecting at one end to said vaporized reactant outlet; (e) a quartz valve comprising a T-shaped body with the straight-through portion of said T-shaped body being in vertical orientation, the bottom opening of said straight-through portion comprising bottom quartz valve inlet and the top opening of said straight-through portion comprising top quartz valve inlet, said bottom quartz valve inlet connecting with the end of said reactant outlet conduit opposite the end connected to said vaporized reactant outlet and said top quartz valve inlet connecting to said second carrier gas outlet conduit at the end opposite the end connecting to said carrier gas header, the third opening of said T-shaped body comprising the quartz valve outlet, said quartz valve having a seat around its internal periphery in said straight-through portion below said quart valve outlet; (f) a moveable quartz check in said quartz valve body which rests on said seat and forms a seal therewith, thereby enabling the passage of carrier gas and vaporized reactant upwardly into said bottom quartz valve inlet and out of said quartz valve outlet when said first carrier gas valve is open and said second carrier gas valve is closed and enabling the passage of carrier gas downwardly into said top quartz valve inlet and out of said quartz valve outlet, but not out of said bottom quartz valve inlet, when said first carrier gas valve is closed and said second carrier gas valve is open; and (g) a reactant vapor delivery conduit connecting at one end with said quartz valve outlet and at the other end with the chemical-vapor deposition vessel in which chemical-vapor deposition is to be effected.

In a second embodiment, the invention is a process for alternately providing either carrier gas commingled with vaporized reactant for chemical-vapor deposition or carrier gas alone, said process utilizing a header valve means and a check valve means to enable switching between delivery of carrier gas commingled with vaporized reactant and delivery of carrier gas alone, said process comprising: (a) heating a reactant in a reactant reservoir to vaporize at least a portion of said reactant in said reservoir; (b) adjusting said header valve means to enable the introduction of carrier gas into said reactant reservoir and the commingling of said carrier gas with said vaporized reactant; (c) passing at least a portion of said commingled carrier gas and vaporized reactant from said reactant reservoir through a check valve means and to a chemical-vapor deposition vessel; and (d) adjusting said header valve means to discontinue introduction of carrier gas into said reactant reservoir and to institute the introduction of carrier gas into said chemical-vapor deposition vessel by passing said carrier gas through said check valve means which permits the passage of said carrier gas into said chemical-vapor deposition vessel but which blocks passage of said carrier gas into said reactant reservoir.

Other embodiments of the present invention encompass further components such as a reactant refill system and a vacuum purge system, all of which are disclosed in the following discussion.

DESCRIPTION OF THE PREFERRED EMBODIMENTS

Figure 1:
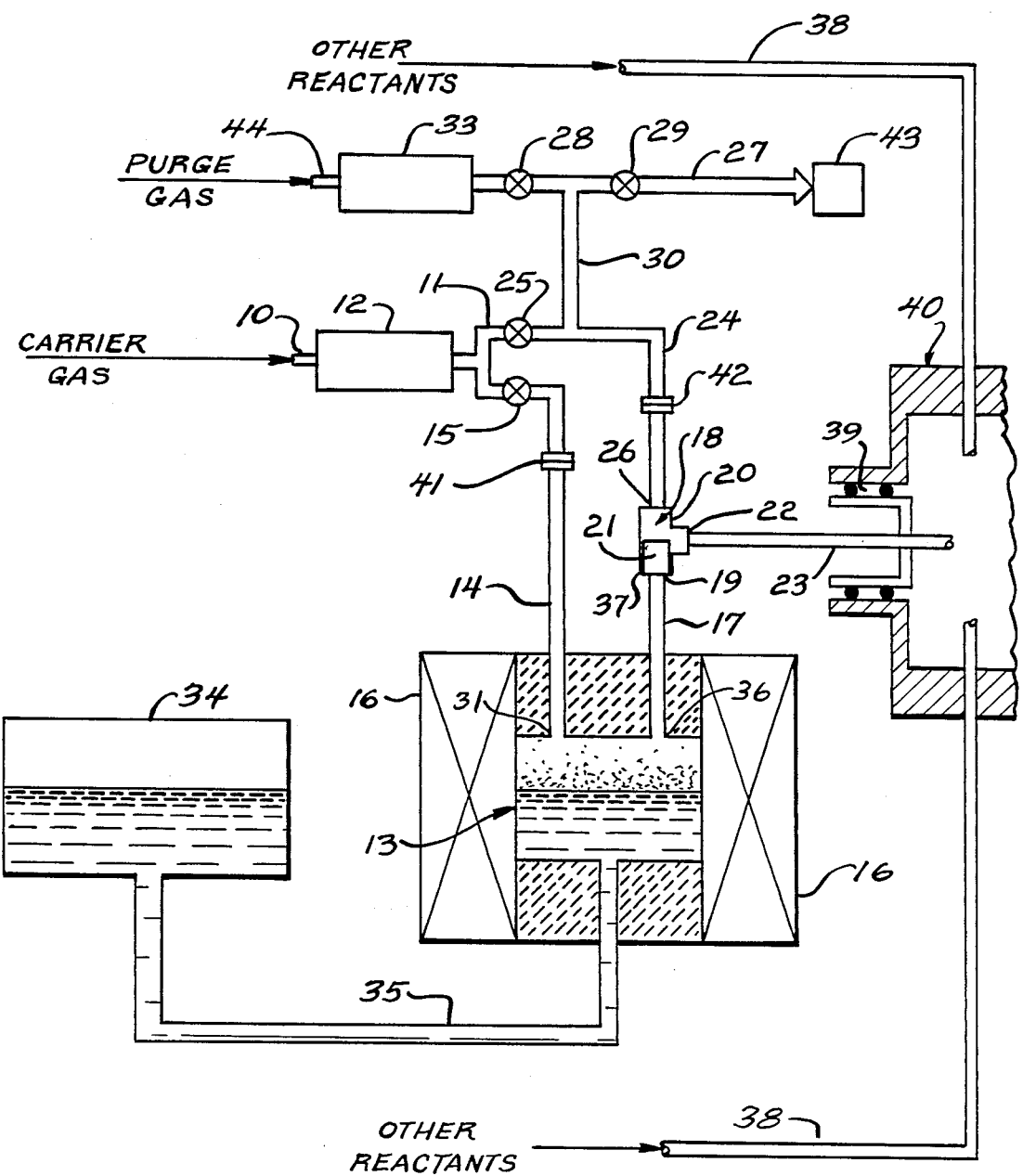
FIG. 1 is a schematic of the preferred embodiment of the vaporized reactant delivery apparatus of the current invention.

Referring to FIG. 1, a vaporized reactant delivery system in accordance with the current invention is shown. Carrier gas from a supply source (not shown) flows through carrier gas inlet conduit 10 to carrier gas header 11. Flow of gas to carrier gas header 11 may be controlled by an optional mass flow controller 12. Carrier gas header 11 is in fluid communication with quartz reactant reservoir 13 via first carrier gas outlet conduit 14. First carrier gas outlet conduit 14 is joined to reactant reservoir 13 at reactant reservoir carrier gas inlet 31. Flow of carrier gas from carrier gas header 11 to reactant reservoir 13 may be controlled by first carrier gas valve 15 in first carrier gas outlet conduit 14. Preferably all or most of first carrier gas outlet conduit 14 is constructed of quartz. The joining of the metal portion to the quartz portion of first carrier gas outlet conduit 14 is indicated by metal-quartz seal 41. Reactant reservoir 13 is heated by heating means 16.

The vaporized reactant outlet 36 of quartz reactant reservoir 13 is in fluid communication with quartz valve 18 via reactant outlet conduit 17. Reactant outlet conduit 17 is joined to quartz valve 18 at bottom quartz valve inlet 19. Quartz valve 18 is comprised of T-shaped body 20 and quartz check 21. Quartz check 21 is movably fitted in the vertically oriented straight-through of T-shaped body 20. Check seat 37 in the internal periphery of quartz valve 18 is located in the straight-through portion of quartz valve 18 and below quartz valve outlet 22. Quartz valve outlet 22 is in fluid communication with reactant vapor delivery conduit 23. Reactant vapor delivery conduit 23 provides vaporized reactant to a chemical-vapor deposition vessel 40 for chemical-vapor deposition. For example, reactant vapor delivery conduit 23 may provide vaporized reactant to a chemical-vapor deposition chamber. Further, it is desirable to provide an insulated seal 39 between the normally metal chemical-vapor deposition vessel 40 and quartz reactant vapor delivery conduit 23.

A system to supply carrier gas without vaporized reactant is comprised of second carrier gas outlet conduit 24 and second carrier gas valve 25 in second carrier gas outlet conduit 24. Second carrier gas outlet conduit 24 provides fluid communication between carrier gas header 11 and quartz valve 18. Second carrier gas outlet conduit 24 is joined to quartz valve 18 at top quartz valve inlet 36. Preferably all or most of second carrier gas outlet conduit 24 is constructed of quartz. The joining of the metal portion to the quartz portion of second carrier gas outlet conduit 24 is indicated by metal quartz seal 42.

Quartz valve 18 of the current invention provides several desired advantages. First, it allows relatively rapid switching between delivery of vaporized reactant (for example, through conduits 17 and 23 in FIG. 1) and delivery of carrier gas alone (for example, through conduits 24 and 23 in FIG. 1). This rapid switching in combination with the supply of other reactants from additional rapidly switched delivery systems (as represented in FIG. 1 by supplemental delivery conduits 38) facilitates the growth of alternating thin epitaxial layers of varied composition. Particularly, it is possible to alternate layers containing vaporized reactant with layers lacking vaporized reactant so that there are abrupt interfaces between the layers. Second, quartz valve 18 facilitates purging processes for the removal of vaporized reactant and carrier gas from a chemical-vapor deposition area and associated conduits. Such purging processes are desirable for the safe loading and unloading of substrate from the deposition area, such as a chemical-vapor deposition chamber.

Optionally, the apparatus of the current invention may include a reactant refill reservoir 34 in fluid communication with reactant reservoir 13 via reactant refill conduit 35. Preferably, reactant refill conduit 35 is connected to enable the gravity feed of reactant from reactant refill reservoir 34 into the bottom of reactant reservoir 13 to minimize thermal shock to heated reactant in reactant reservoir 13 and to maintain a relatively constant reactant level in reactant reservoir 13. A constant level in reactant reservoir 13 helps maintain a relatively constant vapor pressure of vaporized reactant delivered for chemical-vapor deposition. This results in more even and more easily controlled vapor deposition. Preferably, reactant refill reservoir 34 and reactant refill conduit 35 are constructed by quartz.

Optionally, the apparatus of the current invention may employ a purge system comprising a vacuum source means 43 (such as an aspirator or a positive displacement pump), a vacuum supply conduit 27, a third valve 28, a fourth valve 29, a vacuum purge conduit 30 and a purge gas supply conduit 44. Vacuum supply conduit 27 is connected at one end to vacuum source means 43 and at its opposite end to third valve 28. Third valve 28 is also connected to purge gas supply conduit 44. Fourth valve 29 is located in vacuum supply conduit 27. Vacuum purge conduit 30 is connected at one end to vacuum supply line 27 between third valve 28 and fourth valve 29. Vacuum purge line 30 is connected at its opposite end to second carrier gas outlet conduit 24 between second carrier gas valve 25 and top quartz valve inlet 26. The purge system may also include mass flow controller 33 located in purge gas supply conduit 44.

In normal operation of the apparatus of the current invention wherein vaporized reactants are delivered for chemical-vapor deposition, first carrier gas valve 15 is opened and second carrier gas valve 25 is closed allowing carrier gas (such as hydrogen or one of the noble gasses) to flow from its source through carrier gas inlet conduit 10 (and optionally through mass flow controller 12) to carrier gas header 11 then to reactant reservoir 13 via first carrier gas outlet conduit 14. If the purge system is present, valves 28 and 29 are closed. In reactant reservoir 13 the carrier gas commingles with vaporized reactant, such as mercury, phosphorous, zinc, arsenic and organometallic compounds incorporating a heavy metallic unit, such as a rare earth. The commingled carrier gas and reactant exit reactant reservoir 13 through reactant outlet conduit 17, then enter quartz valve 18 through bottom quartz valve inlet 19. In normal operation, the flow of the commingled carrier gas and vaporized reactant lifts quartz check 21 off check seat 37 to allow passage of the commingled stream through quartz valve 18, out quartz valve outlet 22 and into reactant vapor delivery conduit 23 for delivery to chemical-vapor deposition vessel 40.

To supply carrier gas without vaporized reactant, first carrier gas valve 15 is closed and second carrier gas valve 25 is opened. If the purge system is present, valves 28 and 29 are closed. In operation, carrier gas flows from its source through carrier gas inlet conduit 10 (and optionally through mass flow controller 12) to carrier gas header 11, through second carrier gas valve 25 and into second carrier gas outlet conduit 24 to top quartz valve inlet 26 of quartz valve 18. The positive flow of carrier gas forces check 21 into a position which allows flow through reactant vapor delivery conduit 23 and substantially avoids flow into reactant outlet conduit 17. In this fashion, carrier gas without vaporized reactant may be delivered to a chemical-vapor deposition chamber. In typical operation, other reactants from supplemental delivery systems, such as those labeled 38 in FIG. 1, will be provided to the chemical-vapor deposition vessel 40 while carrier gas without vaporized reactant is being provided. This allows growth of alternating epitaxial layers on one substrate.

If the apparatus is equipped with a purge system, the purge system may be operated by closing first carrier gas valve 15, second carrier gas valve 25 and third valve 28 and opening fourth valve 29. The vacuum provided from vacuum source means 43 through vacuum supply conduit 27 and vacuum purge conduit 30 will draw vaporized reactant and carrier gas from conduits 30, 24 and 23, thereby evacuating vaporized reactant and carrier gas from those conduits and from the chemical-vapor deposition equipment to which those conduits are connected.

The vacuum purge operation may be repeated several times to more completely evacuate the apparatus. Also, after completion of the vacuum purge operation a purge gas, such as nitrogen, may be added to the system to enhance the safety of loading and/or unloading a substrate. This may be accomplished in the system illustrated in FIG. 1 by closing first carrier gas valve 15, second carrier gas valve 25, and fourth valve 29 and opening third valve 28. This will allow flow of purge gas, such as nitrogen, through purge gas supply conduit 44, then into vacuum purge conduit 30 and into second carrier gas outlet conduit 24, quartz valve 18, reactant vapor delivery conduit 23 and chemical-vapor deposition vessel 40.

We claim:

1. An apparatus suitable for providing vaporized reactant for chemical-vapor deposition, said apparatus comprising:

a. a heated quartz reactant reservoir for providing a vaporized reactant for chemical-vapor deposition, said reactant reservoir having a reactant reservoir carrier gas inlet and a vaporized reactant outlet;
   b. a carrier gas header having a carrier gas inlet conduit, a first carrier gas outlet conduit and a second carrier gas outlet conduit, said first carrier gas outlet conduit connecting at its end opposite end carrier gas header with said reactant reservoir carrier gas inlet;
   c. a first carrier gas valve in said first carrier gas outlet conduit and a second carrier gas valve in said second carrier gas outlet conduit;
   d. a reactant outlet conduit connecting at one end to said vaporized reactant outlet;
   e. a quartz valve comprising a T-shaped body with the straight-through portion of said T-shaped body being in vertical orientation, the bottom opening of said straight-through portion comprising the bottom quartz valve inlet and the top opening of said straight-through portion comprising the top quartz valve inlet, said bottom quartz valve inlet connecting with the end of said reactant outlet conduit opposite the end connected to said vaporized reactant outlet and said top quartz valve inlet connecting to said second carrier gas outlet conduit at the end opposite the end connecting to said carrier gas header, the third opening of said T-shaped body comprising the quartz valve outlet, said quartz valve having a seat around its internal periphery in said straight-through portion below said quartz valve outlet;
   f. a moveable quartz check in said quartz valve body which rests on said seat and forms a seal therewith, thereby enabling the passage of carrier gas and vaporized reactant upwardly into said bottom quartz valve inlet and out of said quartz valve outlet when said first carrier gas valve is open and said second carrier gas valve is closed and enabling the passage of carrier gas downwardly into said top quartz valve inlet and out of said quartz valve outlet, but not out of said bottom quartz valve inlet, when said first carrier gas valve is closed and said second carrier gas valve is open; and g. a reactant vapor delivery conduit connecting at one end with said quartz valve outlet and at the other end with the chemical-vapor deposition vessel in which chemical-vapor deposition is to be effected.

2. The apparatus of claim 1 further comprising a mass flow controller in said carrier gas inlet conduit.

3. The apparatus of claim 1 wherein said first carrier gas outlet conduit, said second carrier gas outlet conduit and said reactant vapor delivery conduit are at least partially quartz.

4. The apparatus of claim 1 wherein said second carrier gas outlet conduit, said quartz valve and said reactant vapor delivery conduit are heated.

5. The apparatus of claim 1 further comprising a reactant refill reservoir and a reactant refill conduit, said reactant refill conduit connecting at one end to said reactant refill reservoir and at its opposite end with said reactant reservoir enabling the delivery of reactant from said reactant refill reservoir to said reactant reservoir.

6. The apparatus of claim 5 wherein said reactant refill reservoir, said reactant refill conduit and said reactant reservoir are oriented to enable gravity feed of reactant from said reactant refill reservoir through said reactant refill conduit and into said reactant reservoir.

7. The apparatus of claim 5 wherein said reactant refill conduit is connected to said reactant reservoir at or near the bottom of said reactant reservoir.

8. The apparatus of claim 1 further comprising a vacuum purge system, said vacuum purge system comprising:

h. a vacuum source means;

i. a vacuum supply conduit connecting at one end to said vacuum source means and connecting at its opposite end to a third valve, said vacuum supply conduit having a fourth valve positioned between said third valve and said vacuum source means;

j. purge gas supply conduit connecting at one end to a purge gas source and at its opposite end to said third valve; and k. a vacuum purge conduit connecting at one end to said vacuum supply conduit between said third valve and said fourth valve and connecting at its opposite end to said second carrier gas outlet conduit between said second carrier gas valve and said quartz valve thereby providing a vacuum from said vacuum supply means and causing the evacuation of reactant and carrier gas from said quartz valve, from said vacuum purge conduit, from said second carrier gas conduit, from said reactant vapor delivery conduit and from chemical-vapor deposition vessel when said third valve is closed and said fourth valve is open and providing purge gas from said pure gas source to said purge gas supply conduit, said vacuum purge conduit, said second carrier gas outlet conduit, said quartz valve, said reactant vapor delivery conduit and said chemical-vapor deposition vessel when said fourth valve is closed and said third valve is open.

9. The apparatus of claim 8 further comprising a mass flow controller located in said purge gas supply conduit.

10. The apparatus of claim 1 wherein said check is said quartz body is cylindrical.

11. The apparatus of claim 1 wherein said check in said quartz body is frusticonical.

* * * * *

UNITED STATES PATENT AND TRADEMARK OFFICE
CERTIFICATE OF CORRECTION

PATENT NO. : 4,844,006

DATED : July 4, 1989

INVENTOR(S) : Theron V. Page Jr. et al.

It is certified that error appears in the above-identified patent and that said Letters Patent is hereby corrected as shown below:

Column 6, line 42, change "end" to --said-- (last occurrence).

Column 8, line 35, change "is" to --in--.

Signed and Sealed this

Twentieth Day of November, 1990

Attest:

HARRY F. MANBECK, JR.

*Attesting Officer*  *Commissioner of Patents and Trademarks*